United States Patent
Leonard et al.

[11] Patent Number: 6,071,371
[45] Date of Patent: Jun. 6, 2000

[54] METHOD OF SIMULTANEOUSLY ATTACHING SURFACE-MOUNT AND CHIP-ON-BOARD DIES TO A CIRCUIT BOARD

[75] Inventors: Jay F. Leonard; Yanshu Chen, both of Kokomo, Ind.

[73] Assignee: Delco Electronics Corporation, Kokomo, Ind.

[21] Appl. No.: 09/016,908

[22] Filed: Feb. 2, 1998

[51] Int. Cl.[7] .................................................. A05K 3/00

[52] U.S. Cl. .................... 156/297; 156/244.16; 228/175; 29/840

[58] Field of Search ........................ 156/244.12, 244.11, 156/244.16, 297, 299; 264/272.17; 228/175, 180.1, 180.21, 180.22; 29/831, 840, 841

[56] References Cited

U.S. PATENT DOCUMENTS

| | | | |
|---|---|---|---|
| 4,551,488 | 11/1985 | Leech et al. | 523/427 |
| 4,642,321 | 2/1987 | Schoenberg et al. | 523/400 |
| 5,155,904 | 10/1992 | Majd | 29/837 |
| 5,639,010 | 6/1997 | Todd et al. | 228/175 |

OTHER PUBLICATIONS

Gamota et al., Advanced Encapsulant Materials Systems for Flip–Chip–On–Board Assemblies: . . . OEEECPMT Int'l Electronics Manufacturing Technology Symposium (1996), p. 1–9.

*Primary Examiner*—Francis Lorin
*Attorney, Agent, or Firm*—Jimmy L. Funke

[57] ABSTRACT

A process is provided for simultaneously attaching surface-mount (SM) integrated circuit (IC) devices (12) and chip-on-board (COB) IC devices (22) to a circuit board (10) using a combined solder reflow and adhesive cure thermal cycle. The process generally entails placing SM and COB devices (12, 22) on the circuit board (10), such that a suitable solder composition (14) and adhesive (24) are present between the circuit board (10) and the SM and COB devices (12, 22), respectively. The circuit board (10) and devices (12, 22) are then heated so as to simultaneously cure the adhesive (24) and reflow the solder composition (14). A preferred heating step entails at least one thermal cycle that attains a peak temperature well above the cure temperature of the adhesive (24), as well as above the melting or liquidus temperature of the solder composition (14). Accordingly, the thermal cycle is employed to cure the adhesive (24) well outside its conventional cure limits. Thereafter, the circuit board (10) and the devices (12, 22) are cooled to solidify the molten solder (14). The COB device (22) can then be wire bonded to the circuit board (10) and encapsulated in accordance with known practices.

15 Claims, 1 Drawing Sheet

METHOD OF SIMULTANEOUSLY ATTACHING SURFACE-MOUNT AND CHIP-ON-BOARD DIES TO A CIRCUIT BOARD

FIELD OF THE INVENTION

The present invention generally relates to techniques for attaching discreet integrated circuit components to a substrate. More particularly, this invention relates to a process for simultaneously attaching surface-mount (SM) integrated circuit (IC) devices and chip-on-board (COB) IC devices to a circuit board using a combined solder reflow and adhesive cure thermal cycle.

BACKGROUND OF THE INVENTION

Chip-on-board (COB) and surface-mount (SM) devices are types of integrated circuits (IC) well known in the art. A COB is generally an IC chip attached with an adhesive to a substrate, such as a circuit board, with wires electrically interconnecting the chip to conductors on the substrate. The wires and the interconnection are typically formed using wire bonding techniques, in which very thin electrically-conductive wires, often on the order of about 0.25 millimeter or less in diameter, are bonded to leads on the chip and to bond pads on the substrate. Suitable wire bonds can be achieved with various techniques, including thermosonic and ultrasonic bonding. In contrast, SM IC devices are generally characterized by being electrically and mechanically attached to circuit board with one or more terminals or leads that are soldered, such as with a tin-lead solder, to a corresponding number of conductors on the surface of the substrate. A prominent example of a SM IC is a flip chip, which has bead-like terminals typically in the form of solder bumps near an edge of the chip. After registering a flip chip to its corresponding conductor pattern on a substrate, heating above the melting or liquidus temperature of the solder produces solder joints that serve to both secure the chip to the substrate and electrically interconnect the flip chip circuitry to the conductor pattern.

While wire-bonded devices are very robust, their wires are susceptible to damage during handling. Therefore, COBs are typically encapsulated in order to protect their wires. However, suitable encapsulant materials introduce a mismatch in coefficients of thermal expansion with the chip and substrate, which lowers the resistant of a COB to thermal cycle fatigue. As a result, COBs are widely use in consumer electronic products having modest temperature requirements (e.g., up to about 80° C.), but have found limited use in more demanding environments, such as automotive and aerospace applications requiring an upper temperature capability of 125° C. or more. Where both COBs and SM devices have been used, their different attachment methods considerably complicate the processing of the circuit board assembly. Specifically, the prior art has found it necessary to attach and process either the SM devices or the COB devices first, and then perform a second process for the remaining devices. For example, if SM devices are mounted first, solder paste is printed on the circuit board, and the SM devices are then mounted and reflow soldered to the board using a thermal cycle of about four to about seven minutes, during which a peak temperature of at least about 210° C. is attained.

Thereafter, the COB devices are mounted by depositing a silver epoxy adhesive on the circuit board, placing the COB device on the adhesive, curing the adhesive, wire bonding the device, and then encapsulating the device to protect the wires. The adhesive cure is a critical step in mounting COB devices, in that a proper cure is necessary to yield a strong and durable attachment that will withstand thermal cycling without fracture or delamination from the device or substrate. Preferred silver epoxies require an oven cure during which a temperature of typically about 130° C. to about 150° C. is sustained for about thirty to about sixty minutes.

If so desired or required by other process considerations, the COB devices can be attached first by performing the COB attachment process before performing the SM attachment process. With either approach, it can be seen that combining COB and SM devices on a single circuit board is encumbered by the requirement that each type of device is attached at a different time during the assembly process. The different thermal treatment requirements for the adhesives and solders suitable for mounting COB and SM devices, respectively, have prevented any further simplification of the assembly process.

SUMMARY OF THE INVENTION

According to the present invention, a process is provided for simultaneously attaching surface-mount (SM) integrated circuit (IC) devices and chip-on-board (COB) IC devices to a circuit board using a combined solder reflow and adhesive cure thermal cycle. Surprisingly, it has been determined that a thermal cycle sufficient to reflow solder during attachment of a SM device can be performed in such a manner as to also sufficiently cure an adhesive for attaching a COB device.

The process of this invention generally entails placing COB and SM devices on a circuit board, such that a suitable adhesive and solder composition are present between the circuit board and the COB and SM devices, respectively. The circuit board and devices are then heated so as to simultaneously cure the adhesive and reflow the solder composition, the latter of which forms a molten solder joint between the SM device and the circuit board. Thereafter, the circuit board and the devices are cooled such that the molten solder joint solidifies. Preferably, the COB device is then wire bonded to the circuit board and encapsulated in accordance with known practices.

According to the invention, a preferred heating step entails at least one thermal cycle that attains a peak temperature well above the cure temperature of the adhesive, as well as above the melting or liquidus temperature of the solder composition. More preferably, two thermal cycles are employed, each cycle attaining a peak temperature well above the adhesive cure temperature and the solder liquidus/melting temperature. The duration at which the peak temperature is maintained is considerably less than that specified for curing the adhesive, preferably on the order of only several minutes. Accordingly, the present invention employs a modified solder reflow cycle that has been determined to cure an adhesive well outside the specification limits established for the adhesive. However, testing has evidenced that the unconventional cure performed in accordance with this invention yields COB devices whose attachment strength compares very favorably to COB devices attached with the same adhesive that has undergone a conventional cure. In view of this capability, the present invention provides for a viable and greatly simplified process for combining COB and SM devices on a single circuit board.

Other objects and advantages of this invention will be better appreciated from the following detailed description.

BRIEF DESCRIPTION OF THE DRAWING

The above and other advantages of this invention will become more apparent from the following description taken in conjunction with the accompanying drawing, in which.

DETAILED DESCRIPTION OF THE INVENTION

Figure 1:
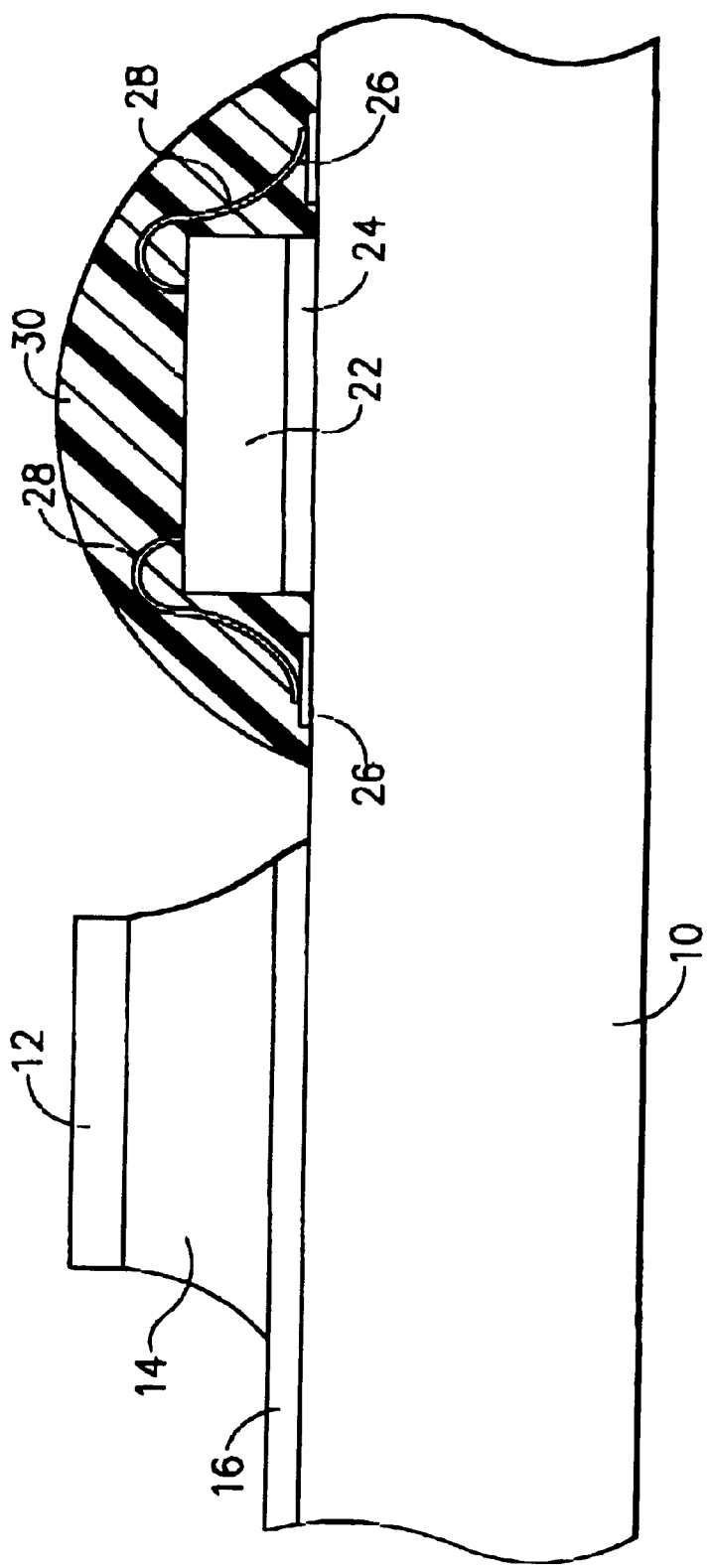
FIG. 1 is a cross-sectional view of a surface-mount device and a chip-on-board device mounted to a circuit board.

Shown in FIG. 1 is a circuit board 10 on which is mounted a SM chip 12 and a COB chip 22. The circuit board 10 can be of any suitable construction, such as a thin-laminate organic, as would be the case for a printed circuit board (PCB) or a printed wiring board (PWB). As is conventional, the SM chip 12 is electrically and physically connected with a solder joint 14 to a conductor 16 on the surface of the circuit board 10. The solder joint 14 is typically formed by placing the chip 12 on a volume of solder paste deposited on the conductor 16, and then reflowing the solder paste by heating the paste to a temperature above the melting or liquidus temperature of the metallic constituent of the paste. The metallic constituent is typically a eutectic or near-eutectic tin-lead solder, the former having a melting temperature of about 183° C. and the latter having a liquidus temperature above 183° C. 63Sn-37Pb is the eutectic, while 60Sn-40Pb is a widely used near-eutectic tin-lead solder that is typically reflowed at about 215° C. to about 220° C. Various other solder compositions could be used, including indium-lead solders having melting/liquidus temperatures above that of tin-lead solders.

The COB die 22 is shown mounted to the circuit board 10 with an adhesive 24. In addition, the die 22 is electrically interconnected to bond pads 26 on the circuit board 10 with thin bond wires 28, such as gold or aluminum wire having a diameter on the order of about 0.03 to about 0.127 millimeter. The die 22 and its bond pads 26 and bond wires 28 are shown as being completely encapsulated with an encapsulant 30 in order to prevent shorting between adjacent wires 28 and to generally protect the assembly from damage. According to this invention, commercially-available silver epoxies can be used to bond the COB chip 22 to the circuit board 10 as long as the adhesive has a sufficiently high temperature capability to provide a high-strength bond at the temperature extremes required for the circuit assembly. Suitable materials for the adhesive 24 contain a filler material and a curative that triggers curing at an elevated temperature in a range of about 30° C. to about 150° C. The filler material may be any suitable substance capable of yielding the desired flow, electrical, mechanical and thermal properties for the adhesive 24, as understood by those skilled in the art.

Preferred materials for the encapsulant 30 are those with CTEs that minimize thermal mismatch with the chip 22, wires 28 and encapsulant 30. The encapsulant 30 must also be suitable for the intended environment of the assembly, which generally necessitates a relatively low density, high modulus and fracture toughness, and some degree of resistance to chemical attack and elevated temperatures. An example of a preferred adhesive is Hysol 4450/445, available from Dexter/Hysol, having a cure temperature of about 125° C.

Those skilled in the art will appreciate that the SM and COB chips 12 and 22 shown in FIG. 1 are merely schematic representations of such devices, and serve the purpose of assisting in the description of this invention. Therefore, the teachings of this invention are not to be limited to those configurations shown in Figure, but instead can be generally applied to electronic assemblies that utilize essentially any combination of surface mount technology (SMT) IC packages and COB IC packages that require attachment with solder and adhesive, respectively.

According to the invention, the SM chip 12 and the COB chip 22 are simultaneously attached to the circuit board 10 by merging their assembly steps and employing a single heating step that serves to both reflow the solder paste between the SM chip 12 and conductor 16 and to cure the adhesive 24 between the COB chip 22 and the circuit board 10. The process of this invention generally entails printing a solder paste on the conductor 16 using known techniques, such as screen printing, and then dispensing the adhesive 24 on the circuit board 10, as evident from FIG. 1. The chips 12 and 22 are then placed in their respective solder paste and adhesive 24 in any suitable manner. The assembly is then heated to a temperature sufficient to reflow the solder paste, i.e., above the melting or liquidus temperature of the metallic constituent of the solder paste. A preferred reflow temperature is about 205° C. to about 215° C. for 63Sn-37Pb solder. Lower and higher reflow temperatures are foreseeable, depending on the solder used, though as a general rule a minimum reflow temperature is about 205° C. in order for the solder joint to exhibit adequate strength at elevated temperatures to which the SM chip 12 is subjected in service. Furthermore, the reflow temperature must be maintained for a sufficient time to allow the solder to flow and coalesce to form the solder joint 14 shown in FIG. 1.

Notably, the reflow temperature for the solder paste is well above the cure temperature of the adhesive 24. For example, typical cure temperatures for adhesives suitable for attaching COB chips are in the range of about 125° C. to about 150° C., with the epoxy given as an example above having a cure temperature of about 125° C. Furthermore, cure times for such adhesives are generally on the order of about fifteen to sixty minutes. In contrast, time at peak reflow temperature is typically about twenty to about forty seconds during a conventional reflow operation in order to allow the solder to adequately flow and coalesce. Though this discrepancy in temperature requirements exists, it has been unexpectedly determined that a modified thermal cycle can be performed that is capable of both reflowing the solder paste and curing the adhesive 24 without degrading the adhesive 24 or having a negative effect on the solder joint 14. The thermal cycle of this invention entails a peak temperature at the reflow temperature of the solder, which is maintained for about forty to about sixty seconds. Accordingly, the peak temperature is well above the cure temperature of the adhesive 24. Furthermore, the time at peak temperature is considerably less than that conventionally believed necessary to cure the adhesive 24, and longer than that conventionally employed to reflow solders.

Following the thermal cycle, the circuit board and chips 12 and 22 are cooled such that the molten solder solidifies and forms the joint 14 shown in FIG. 1. Thereafter, the COB chip 22 is wire bonded to the bond pads 26 on the circuit board 10, and then encapsulated with the encapsulant 30 in accordance with known methods. A preferred encapsulation technique is disclosed in (Attorney's Docket No. H-199333).

During the investigation that resulted in this invention, there were concerns for the feasibility of the process, and particularly the compatibility of the adhesive cure and solder reflow requirements, as well as cross-contamination of materials during the assembly process. The primary concern was for the strength of the adhesive 24 in view of the non-optimal cure conditions imposed by the solder reflow requirements. The basis of this concern was that a higher cure temperature and shorter cure period would significantly reduce the shear strength of materials suitable for use as the adhesive 24. An evaluation was undertaken in which thermal cycle testing was performed on circuit boards separated into three groups—Groups A, B and C. The circuit boards of Groups B and C were each printed with a Sn—Pb solder paste having a minimum required reflow temperature of about 205° C. COB chips were then mounted to all of the circuit boards with an epoxy adhesive available from Ablestic under the name Ablebond, and having a prescribed cure of fifteen minutes at 125° C. The Group A specimens underwent an oven cure at 125° C. for fifteen minutes (i.e., optimal conditions for the adhesive). The Group B specimens underwent a single pass through an oven at 215° C. for about three minutes, while Group C were subjected to two passes through the oven under the same conditions as those set for Group B. During each three-minute oven cycle, the temperature of each circuit board exceeded the liquidus temperature of the solder for about forty to sixty seconds. The Group C specimens were allowed to cool down before the second thermal cycle was performed. The COB chips were then subjected to shear testing, the results of which were as follows:

|  | Average (kg) | Std. Dev. (kg) |
| --- | --- | --- |
| Group A: | 35.45 | 5.89 |
| Group B: | 16.68 | 4.28 |
| Group C: | 26.13 | 4.70 |

Shear was by delamination between the chip and adhesive in Group A, while Group B and C specimens delaminated at the adhesive-board interface. While the specimens of Groups B and C exhibited lower shear strengths than those of Group A, each was surprisingly sufficient to meet all reliability requirements. From these results, it was determined that an attachment adhesive for a COB device could be successfully cured using a modified solder reflow cycle, particularly if two separate temperature cycles were employed. Notably, subjecting the solder paste to two reflow cycles did not have a detrimental effect of the resulting solder.

While our invention has been described in terms of a preferred embodiment, it is apparent that other forms could be adopted by one skilled in the art. Accordingly, the scope of our invention is to be limited only by the following claims.

What is claimed is:

1. A method for simultaneously attaching an adhesive-bonded IC device and a solder-bonded IC device to a substrate, the method comprising the steps of:

placing a first IC device and a second IC device on a circuit board, an adhesive being present between the first IC device and the circuit board, the adhesive having a cure temperature and a cure time by which the adhesive is fully cured at the cure temperature, a solder composition being present between the second IC device and the circuit board, the solder composition having a liquidus temperature above the cure temperature of the adhesive;

heating the circuit board and the first and second IC devices through at least one thermal cycle so as to simultaneously cure the adhesive and reflow the solder composition to form a molten solder joint between the second IC device and the circuit board, the thermal cycle attaining a peak temperature above the cure temperature of the adhesive and above the liquidus temperature of the solder composition for a duration less than the cure time of the adhesive; and then cooling the circuit board and the first and second IC devices such that the molten solder joint solidifies.

2. A method as recited in claim 1, further comprising the step of encapsulating at least one of the first and second IC devices with an encapsulation material after the cooling step.

3. A method as recited in claim 1, further comprising the step of depositing the solder composition on the circuit board prior to placing the first and second IC devices on the circuit board.

4. A method as recited in claim 1, wherein the first IC device is a chip-on-board die.

5. A method as recited in claim 1, wherein the second IC device is a surface-mount die.

6. A method as recited in claim 1, further comprising the step of curing the encapsulation material after the encapsulation step.

7. A method as recited in claim 1, further comprising the step of wire bonding the first IC device to the circuit board following the heating step.

8. A method as recited in claim 1, wherein the heating step entails a second thermal cycle, the second thermal cycle attaining a peak temperature above the cure temperature of the adhesive and above the liquidus temperature of the solder composition for a duration shorter than the cure time of the adhesive.

9. A method as recited in claim 8, wherein the heating step entails a cooldown during which the circuit board is allowed to cool before the second thermal cycle.

10. A method as recited in claim 1, wherein the cure temperature of the adhesive is up to 150° C., the liquidus temperature of the solder composition is at least 183° C., and the peak temperature is at least 205° C. and is maintained for a duration of about 40 to about 60 seconds.

11. A method for simultaneously attaching a chip-on-board IC die and a surface-mount IC die to a circuit board, the method comprising the steps of:

printing a solder paste on a circuit board;

placing a chip-on-board IC die and a surface-mount IC die on the circuit board such that an adhesive is present between the chip-on-board IC die and the circuit board and the solder paste is between the surface-mount IC die and the circuit board the adhesive having a cure temperature and a cure time by which the adhesive is fully cured at the cure temperature. the solder paste having a liquidus temperature above the cure temperature of the adhesive;

heating the circuit board, the chip-on-board IC die and the surface-mount IC die to a peak temperature sufficient to reflow the solder paste and above the cure temperature of the adhesive, the peak temperature being maintained for a duration less than the cure time of the adhesive, the heating step causing the adhesive to cure and the solder paste to reflow and form a molten solder joint between the surface-mount IC die and the circuit board;

cooling the circuit board, the chip-on-board IC die and the surface-mount IC die such that the molten solder joint solidifies;

wire bonding the chip-on-board IC die to the circuit board;

encapsulating the chip-on-board IC die with an encapsulation material; and then curing the encapsulation material.

12. A method as recited in claim 11, wherein the adhesive is an epoxy.

13. A method as recited in claim 11, wherein the heating step entails two thermal cycles between which the circuit board is allowed to cool, each thermal cycle attaining the peak temperature above the cure temperature of the adhesive and above the liquidus temperature of the solder paste for a duration shorter than the cure time of the adhesive.

14. A method as recited in claim 13, wherein the cure temperature of the adhesive is up to 150° C., the liquidus temperature of the solder paste is at least 183° C., and the peak temperature during each of the thermal cycles is above the liquidus temperature and is maintained for a duration of about 40 to about 60 seconds.

15. A method as recited in claim 11, wherein the cure temperature of the adhesive is up to 150° C., the liquidus temperature of the solder paste is at least 183° C., and the peak temperature is at least 205° C. and is maintained for a duration of about 40 to about 60 seconds.

* * * * *